United States Patent [19]
Tascillo et al.

[11] Patent Number: 5,635,651
[45] Date of Patent: Jun. 3, 1997

[54] DYNAMOMETER FAULT DETECTION SYSTEM

[75] Inventors: Mark A. Tascillo, Canton; Pravinchandra P. Chokshi, Livonia; James E. Snider, Taylor; Richard E. Smith, Farmington Hills, all of Mich.

[73] Assignee: Ford Motor Company, Dearborn, Mich.

[21] Appl. No.: 521,499

[22] Filed: Aug. 30, 1995

[51] Int. Cl.⁶ .................................................. G01L 3/00
[52] U.S. Cl. ................................. 73/862.18; 324/772
[58] Field of Search .................. 73/862.08, 862.09, 73/862.17, 862.18; 361/20, 21, 51, 90; 324/772

[56] References Cited

U.S. PATENT DOCUMENTS

| | | |
|---|---|---|
| 2,618,969 | 11/1952 | Hornbarger . |
| 2,785,367 | 3/1957 | Roman et al. . |
| 3,864,965 | 2/1975 | Anderson ........................... 73/862.18 |
| 3,947,764 | 3/1976 | Abbott et al. ........................ 324/772 |
| 4,257,261 | 3/1981 | Ono et al. . |
| 4,584,623 | 4/1986 | Bello et al. ........................... 361/90 |

*Primary Examiner*—Richard Chilcot
*Assistant Examiner*—Ronald Biegel
*Attorney, Agent, or Firm*—Mark S. Sparschu

[57] ABSTRACT

In one embodiment of the present invention, a fault detection system for a dynamometer includes circuitry for measuring the armature voltage of the dynamometer. The voltage can used as an indicator of dynamometer speed to prevent reverse rotation of the dynamometer and to prevent overspeed operation of the dynamometer.

9 Claims, 1 Drawing Sheet

DYNAMOMETER FAULT DETECTION SYSTEM

BACKGROUND OF THE INVENTION

1. Field of the Invention

The present invention relates to dynamometer control.

2. Description of the Related Art

Dynamometers are used extensively in the testing of internal combustion engines. In speed control of a typical DC dynamometer, closed-loop speed control is effected by feeding back dynamometer speed to the dynamometer controller. Speed is frequently sensed by a sensor having magnetic pickup which senses the rotation of a toothed wheel which rotates with the dynamometer output shaft. The pickup provides both a DC voltage proportional to dynamometer speed and a directional bit, the bit indicating whether the dynamometer is rotating in the forward or reverse direction.

Such a speed detection system can at times be unreliable. The unreliability is sometimes due to the failure of a component in the speed detection system. The unreliability is also sometimes due to the precision required in the installation of the magnetic pickup. If such precision is not present, the speed and direction detection may fail.

A failure in the detection of the speed of a dynamometer can result in the dynamometer going into an overspeed condition. This would result because the dynamometer control strives to keep the dynamometer running at a speed regulation point. If the speed feedback provided by the speed sensor fails, the dynamometer control will believe that the dynamometer is not running fast enough. The dynamometer control will then try feverishly to increase the speed of the dynamometer to reach the speed regulation point. The result will be overspeed of the dynamometer, which can damage an engine coupled to the dynamometer.

Failure of the directional bit of the dynamometer's speed sensor can also have an adverse effect. During an emergency stop of a dynamometer, the dynamometer controller attempts to force the speed of the dynamometer to zero as quickly as possible. This typically entails reversing the polarity of the field voltage of the dynamometer. The directional bit tells the dynamometer controller when the dynamometer has crossed zero speed and is beginning reverse rotation. At this point, the emergency stop procedure is ended. If the directional bit fails, the dynamometer will continue to be driven in reverse. As those familiar with internal combustion engines will attest, driving an automobile engine in reverse has the potential to do great damage to the engine.

As a backup in the case of failure of the directional bit, the speed pickup of the dynamometer can be used to prevent reverse rotation. When the speed pickup is so used, the speed of the dynamometer is sensed during an emergency stop. When the speed reaches a low-speed cutout threshold, the controller ends the emergency stop procedure to prevent reverse rotation of the dynamometer. However, the use of the speed pickup in this way has disadvantages. First, the speed pickup has fundamental reliability limitations, as was discussed above. Further, if the deceleration of the dynamometer is fast enough, the dynamometer can move through zero speed and begin to accelerate into reverse rotation very quickly. Because a typical speed pickup is unipolar, reverse rotation looks the same as forward rotation. If acceleration in reverse occurs quickly, the dynamometer may run above the low-speed cutout threshold in the reverse direction. The controller has no way to distinguish this rotation from proper forward rotation.

In light of the aforementioned limitations in conventional dynamometer control systems, a system which provides improved reliability in preventing overspeed and reverse rotation conditions will provide advantages over the prior art.

SUMMARY OF THE INVENTION

The present invention provides a fault detection system for a DC dynamometer having an armature. The system comprises detection means for detecting an armature voltage of the dynamometer. The system also includes comparison means for comparing the voltage with a predetermined voltage threshold. Further, the present system includes control means responsive to the comparison means for interrupting power to the dynamometer.

The present invention also provides a second fault detection system for a DC dynamometer having an armature. The fault detection system includes a speed sensor coupled to measure the speed of the dynamometer, the speed sensor having an output signal. The system further comprises detection means for detecting an armature voltage of the dynamometer. In addition, the system contains difference means for generating a difference signal indicative of the difference between the speed sensor output signal and the detected voltage. Further, the system includes comparison means for comparing the difference signal with a predetermined voltage threshold. Also, the system comprises control means responsive to the comparison means for interrupting electrical power to the dynamometer.

The present invention also provides a fault detection method for a DC dynamometer having an armature. The method includes detecting an armature voltage of the dynamometer. Also, the method comprises comparing the voltage with a predetermined voltage threshold and selectively interrupting power to the dynamometer in response to the comparison.

The present invention additionally provides a second fault detection method for a DC dynamometer having an armature and having a speed sensor for sensing the speed of the dynamometer. The method includes detecting an armature voltage of the dynamometer and generating a difference signal indicative of a difference between an output signal of the speed sensor and the detected armature voltage. Further, the method involves comparing the difference signal with a predetermined voltage threshold and selectively interrupting power to the dynamometer in response to the comparison.

The present invention enables overspeed and reverse rotation detection with enhanced reliability over conventional systems. In doing so, the present invention provides advantages over the prior art.

DETAILED DESCRIPTION OF THE PREFERRED EMBODIMENT

Figure 1:
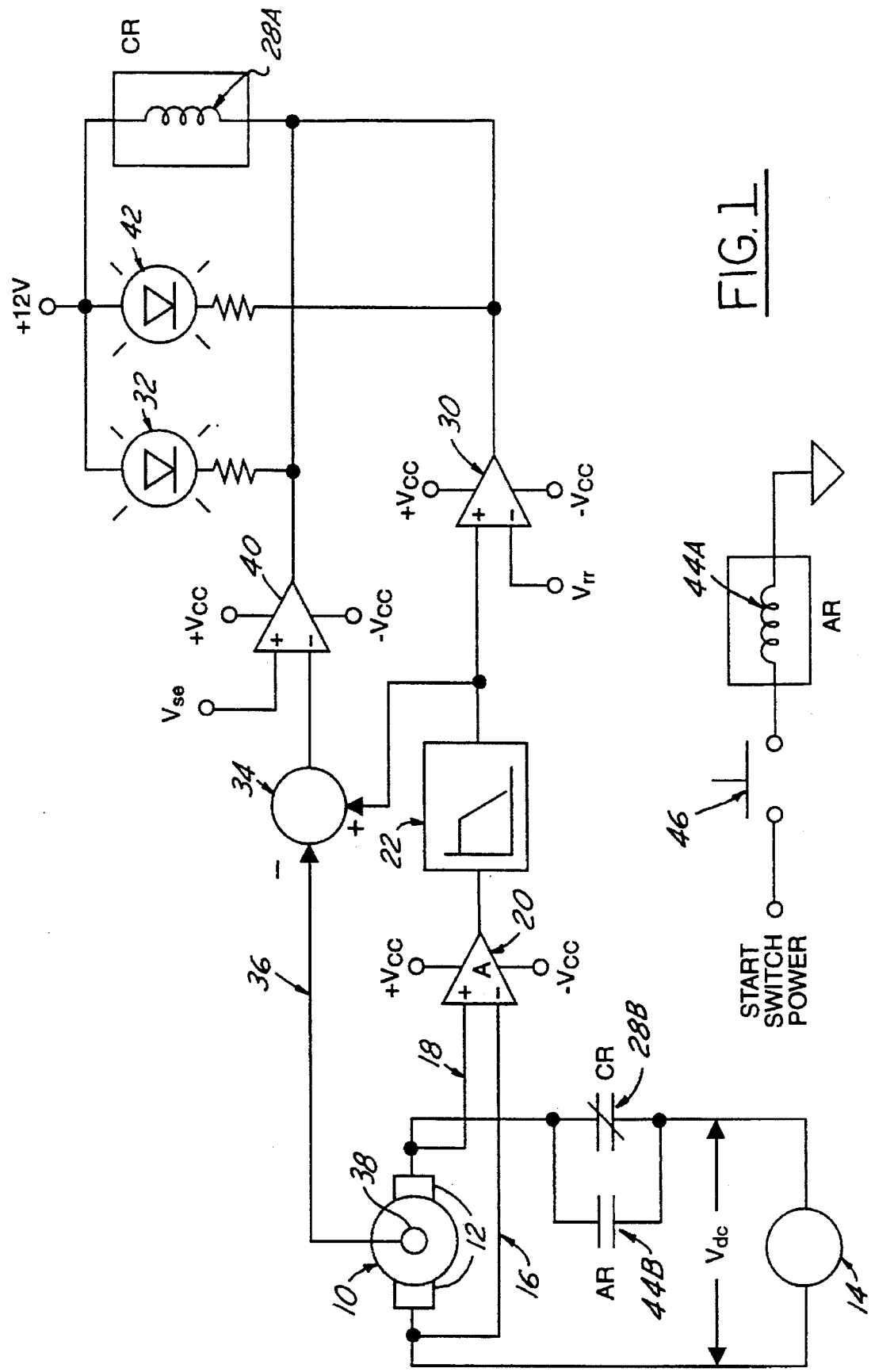
FIG. 1 illustrates a dynamometer fault detection system according to one embodiment of the present invention.

Referring now to FIG. 1, a dynamometer fault detection system according to one embodiment of the present invention will be described. The system includes a DC dynamometer 10, which is mechanically coupled to an engine (not shown) under test. The armature 12 of dynamometer 10 is provided a DC voltage by armature voltage source 14, as is conventional in the art. Control of dynamometer 10 is carried out by conventional means practiced in the art.

The armature voltage of dynamometer 10 is differentially provided by circuits 16 and 18 to differential amplifier 20. Differential amplifier 20 has its power supply inputs coupled to $+V_{cc}$ and $-V_{cc}$, thus being able to read and output both positive and negative voltages. As an example for one implementation of this system, $+V_{cc}$ and $-V_{cc}$ are +15 volts and −15 volts, respectively.

The output of amplifier 20 is filtered, if needed, by low-pass filter 22 to remove electrical noise. As an example for one implementation of this system, low-pass filter 22 is a two-pole active filter with a break frequency of 50 Hz.

The output of low-pass filter 22 is fed to the non-inverting input of comparator 30. Coupled to the inverting input of comparator 30 is a predetermined voltage threshold $V_{rr}$. Voltage threshold $V_{rr}$ represents an armature voltage of dynamometer 10 that would be measured as dynamometer 10 approaches or enters reverse rotation.

If the detected armature voltage of dynamometer 10 is less than $V_{rr}$, comparator 24 will cause two results. One, an LED 32 will be lit to provide a visible indication of the actual or impending reverse rotation condition. Two, the coil 28A of control relay CR will be energized. This will cause the normally-closed contact 28B of control relay CR to open. This will de-energize dynamometer 10, causing it to coast to a stop.

$V_{rr}$ can be selected to have a number of values. $V_{rr}$ can be zero volts. This is the threshold at which the armature voltage of dynamometer 10 will transition from positive to negative upon reversal of rotation of dynamometer 10. $V_{rr}$ can also be selected to have a small positive voltage. This small positive voltage is indicative of the armature voltage of dynamometer 10 as dynamometer 10 slows to nearly a zero speed. In order to prevent dynamometer 10 from transitioning into reverse rotation, cutting off power to armature 12 of dynamometer 10 as dynamometer 10 slows to nearly zero speed can be advantageous. If the engine coupled to dynamometer 10 can stand a small amount of reverse rotation, $V_{rr}$ can have a small negative value. The advantage to $V_{rr}$ having a small negative value is that control relay CR will open the armature circuit only upon actual reverse rotation. Thus, "false alarms" will not occur.

Also coupled to the output of low-pass filter 22 is difference generator 34. Coupled to the negative input of difference generator 34 is speed sensor circuit 36. Speed sensor circuit 36 comes from a speed sensor 38 coupled in proximity to the output shaft of dynamometer 10 to measure the speed of the output shaft. Speed sensor 38 is a conventional feature of dynamometers and typically provides a DC output voltage proportional to the speed of dynamometer 10.

Difference generator 34 is preferably an operational amplifier connected to provide an output signal whose voltage is proportional to the difference between the voltage across the inputs to the operational amplifier. Such circuits are well-known to those skilled in the art and will not be further described here.

The output of difference generator 34 is thus the difference between the speed of dynamometer 10 as measured by detecting the armature voltage of dynamometer 10 and as measured by speed sensor 38. If this discrepancy is greater than a voltage threshold $V_{se}$, as determined by comparator 40, a speed-detection problem is indicated. Most likely, the speed-detection problem is accompanied by an impending or actual overspeed runaway condition of dynamometer 10, since speed feedback has been lost. Comparator 40 turns on LED 42 to visually enunciate the problem and opens contact 28B of control relay CR.

One skilled in the art will recognize that if additional current-drive capability is necessary to drive both the appropriate LED 32 or 42, along with coil 28A of control relay CR, transistors or buffer circuitry can be provided at the outputs of comparators 30 and 40.

One will also recognize that the various comparisons and logic performed by the circuitry of FIG. 1 can be performed by a microprocessor without departing from the spirit of the present invention. Such use of a microprocessor would be facilitated by analog-to-digital converting the voltage across armature 12 such that the voltage could be readily manipulated by the microprocessor.

Provided across normally-closed contact 28B of control relay CR is normally-open contact 44B of auxiliary relay AR. When start switch 46 (a conventional feature of dynamometer 10) is pressed to start dynamometer 10, coil 44A of auxiliary relay AR pulls in contact 44B. This allows the armature circuit of dynamometer 10 to be completed regardless of the state of contact 28B of control relay CR. If threshold $V_{rr}$ is a positive value, contact 28B of control relay CR will be held open by comparator 30 when dynamometer 10 is at rest, preventing the starting of dynamometer 10 in the absence of auxiliary relay AR. Note that if only the feature provided by comparator 40 is desired (that is, only speed-error protection), or if $V_{rr}$ is not a positive value, auxiliary relay AR is not needed to allow starting of dynamometer 10.

It will be appreciated that the system described here will allow for enhanced overspeed and reverse rotation protection without the requirement for added sensors on dynamometer 10.

Various other modifications and variations will no doubt occur to those skilled in the arts to which this invention pertains. Such variations which generally rely on the teachings through which this disclosure has advanced the art are properly considered within the scope of this invention. This disclosure should thus be considered illustrative, not limiting; the scope of the invention is instead defined by the following claims.

What is claimed is:

1. A fault detection system for a DC dynamometer having an armature, said system comprising:

detection means for detecting an armature voltage of said dynamometer;

comparison means for comparing said voltage with a predetermined voltage threshold; and control means responsive to said comparison means for interrupting power to said dynamometer; wherein said predetermined voltage threshold represents a forward dynamometer speed threshold; and said control means interrupts power to said dynamometer if the detected armature voltage indicates a reverse rotation of said dynamometer or a forward rotation of said dynamometer at lower speed than said forward dynamometer speed threshold.

2. A fault detection system as recited in claim 1, wherein said control means comprises a relay having a contact coupled in series with said armature.

3. A fault detection system as recited in claim 2, wherein said detection means comprises an amplifier with first and second differential inputs coupled across said armature.

4. A fault detection system for a DC dynamometer having an armature, said system comprising:

detection means for detecting an armature voltage of said dynamometer;

comparison means for comparing said voltage with a predetermined voltage threshold; and control means responsive to said comparison means for interrupting power to said dynamometer; wherein said predetermined voltage threshold represents a zero dynamometer speed threshold; and said control means interrupts power to said dynamometer if the detected armature voltage indicates a reverse rotation of said dynamometer.

5. A fault detection system as recited in claim 4 wherein said control means comprises a relay having a contact coupled in series with said armature.

6. A fault detection system as recited in claim 5 wherein said detection means comprises an amplifier with first and second differential inputs coupled across said armature.

7. A fault detection system for a DC dynamometer having an armature, said system comprising:

detection means for detecting an armature voltage of said dynamometer;

comparison means for comparing said voltage with a predetermined voltage threshold; and control means responsive to said comparison means for interrupting power to said dynamometer; wherein said predetermined voltage threshold represents a reverse dynamometer speed threshold; and said control means interrupts power to said dynamometer if the detected armature voltage indicates a reverse rotation of said dynamometer at a greater speed than said reverse dynamometer speed threshold.

8. A fault detection system as recited in claim 7 wherein said control means comprises a relay having a contact coupled in series with said armature.

9. A fault detection system as recited in claim 8 wherein said detection means comprises an amplifier with first and second differential inputs coupled across said armature.

* * * * *